(12) United States Patent
Chang

(10) Patent No.: US 11,614,919 B2
(45) Date of Patent: Mar. 28, 2023

(54) CIRCUIT

(71) Applicant: Realtek Semiconductor Corporation, Hsinchu (TW)

(72) Inventor: Szu-Chun Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 356 days.

(21) Appl. No.: 16/992,421

(22) Filed: Aug. 13, 2020

(65) Prior Publication Data

US 2021/0048983 A1    Feb. 18, 2021

(30) Foreign Application Priority Data

Aug. 16, 2019   (TW) .................. 108129348

(51) Int. Cl.
G06F 7/523  (2006.01)
G06F 5/01   (2006.01)
H03K 19/21  (2006.01)

(52) U.S. Cl.
CPC ............... G06F 7/523 (2013.01); G06F 5/01 (2013.01); H03K 19/21 (2013.01)

(58) Field of Classification Search
CPC ...... G06F 17/147; G06F 7/5057; G06F 7/523; G06F 7/53; G06F 5/01; G06F 2207/5354; H04N 19/60–649
See application file for complete search history.

(56) References Cited

U.S. PATENT DOCUMENTS 6,029,185 A *  2/2000 Tonomura ............. G06F 17/147
                                               708/603
2006/0129622 A1* 6/2006 Dang ................... G06F 17/147
                                               708/406

FOREIGN PATENT DOCUMENTS

CN    103092559 B    12/2015

OTHER PUBLICATIONS

Wen-Hsiung Chen et al., "A Fast Computational Algorithm for the Discrete Cosine Transform", IEEE Transactions on Communications, vol. COM-25, No. 9, Sep. 1977.
Jong-Sik Park et al., "2-D Large Inverse Transform (16x16, 32x32) for HEVC (High Efficiency Video Coding)", Journal of Semiconductor Technology and Science, vol. 12, No. 2, Jun. 2012.

* cited by examiner

*Primary Examiner* — Emily E Larocque
(74) *Attorney, Agent, or Firm* — Locke Lord LLP; Tim Tingkang Xia, Esq.

(57) ABSTRACT

A circuit, comprising a first term operation circuit and a second term operation circuit, a third term operation circuit, and a second calculation circuit. Each of the first and the second term operation circuits comprises multiple higher bit operation circuits, a lowest bit operation circuit, and a first calculation circuit. Each of the higher bit operation circuits selectively left-shifts a multiplicand by different bits, outputs the shifted multiplicand, determines a sign of the shifted multiplicand, and left-shifts the shifted multiplicand. The lowest bit operation circuit outputs the multiplicand, and determines a sign of the multiplicand. The first calculation circuit generates a term operation result. The third term operation circuit generates a third term operation result. The second calculation circuit adds the term operation result of the first and second term operation circuits and the third term operation result to generate a total operation result.

13 Claims, 3 Drawing Sheets

CIRCUIT

CROSS-REFERENCE TO RELATED APPLICATION

This application claims priority to Taiwan Application Serial Number 108129348, filed Aug. 16, 2019, which is herein incorporated by reference in its entirety.

BACKGROUND

Technical Field

This disclosure is relates to a computation technique, and in particular to a computation circuit used in DCT, DST, IDCT, and IDST.

Description of Related Art

With the increasing application of multimedia technology in the military and civilian fields, and the continuous development of the consumer electronics, video compression technology has become a research area that attracts much attention. The video compression technology is the main technology for constructing and playing videos, and is the basis for all video applications. The video compression and decompression process often requires computations used in DCT, DST, IDCT, and IDST, and the complexity of the circuit is quite large.

Therefore, it is an industry problem to be solved to design a new computation circuit used in DCT, DST, IDCT, and IDST, to achieve the purpose of rapid operations to reduce the circuit delay.

SUMMARY

This summary is intended to provide a simplified summary of this disclosure so that the reader may have a basic understanding of this disclosure. This summary is not a comprehensive overview of this disclosure, and it is not intended to indicate important/critical elements of the embodiments of the present invention or to define the scope of the present invention.

One purpose of this summary is used to provide a circuit, comprising: a first term operation circuit and a second term operation circuit, a third term operation circuit, and a second calculation circuit. Each of the first term operation circuit and the second term operation circuit comprises a plurality of higher bit operation circuits, a lowest bit operation circuit, and a first calculation circuit. Each of the higher bit operation circuits is configured to selectively left-shift a multiplicand by different bits according to the shifting control signal determined by the multiplier to generate a shifted multiplicand, configured to output the shifted multiplicand only according a valid level of a bit valid control signal determined by a multiplier, configured to determine a sign of the shifted multiplicand according to a bit sign control signal and a term sign signal determined by the multiplier, and configured to left-shift the shifted multiplicand by more bits when the bit corresponding to the higher bit operation circuit is higher to generate a higher bit operation result. The lowest bit operation circuit is configured to output the multiplicand only according to a valid level of a lowest bit valid control signal determined by the multiplier, and configured to determine a sign of the multiplicand according to a lowest bit sign control signal and the term sign signal determined by the multiplier to generate a lowest bit operation result. The first calculation circuit capable of adding the higher operation results and the lowest bit operation result to generate a term operation result. The third term operation circuit is configured to output an addend according to a valid level of a term valid control signal, determine a sign of the addend according to the term sign control signal, and add the addend to the summation of a two's complement to generate a third term operation result. The second calculation circuit capable of adding the term operation result of the first and second term operation circuits and the third term operation result to generate a total operation result.

The computation circuit of the present invention facilitates circuit synthesis in an easy-to-simplify manner, and has the advantages of low delay and small area.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
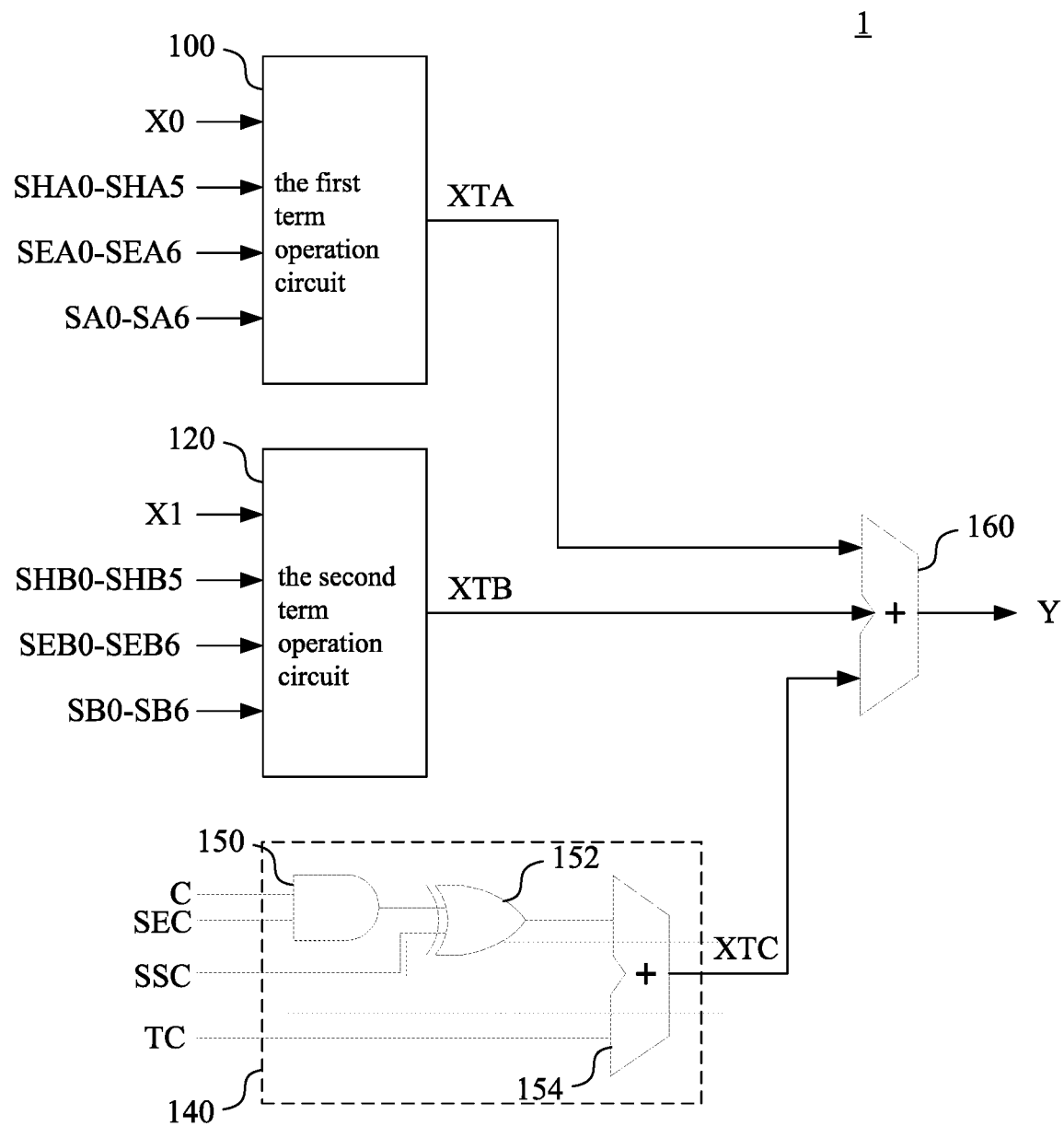
FIG. 1 is a block diagram of a computation circuit used in DCT, DST, IDCT, and IDST in an embodiment of the present invention.

Reference is made to FIG. 1. FIG. 1 is a block diagram of a computation circuit 1 used in DCT, DST, IDCT, and IDST in an embodiment of the present invention. More specifically, the computation circuit 1 may be used to perform a discrete sine transform (DST), a discrete cosine transform (DCT), an inverse discrete sine transform (IDST), and an inverse discrete cosine transform (IDCT).

The computation circuit 1 includes a first term operation circuit 100, a second term operation circuit 120, a third term operation circuit 140, and a second calculation circuit 160.

In one embodiment, the video compression and decompression process often requires computations in DCT, DST, IDCT, and IDST. A method for performing the transform usually includes the following calculations: $Y=\pm X0 \times A \pm X1 \times B \pm C$, where X0 is the multiplicand of the first term, A is the multiplier of the first term, which is a constant, X1 is the multiplicand of the second term, B is the multiplier of the second term, which is a constant, and C is the input value to be added or subtracted from the previous level.

Therefore, the first term operation circuit 100, the second term operation circuit 120, and the third term operation circuit 140 described above calculate the first term ($\pm X0 \times A$), the second term ($\pm X1 \times B$), and the third term (C) in the above-mentioned expression, respectively.

Figure 2A:
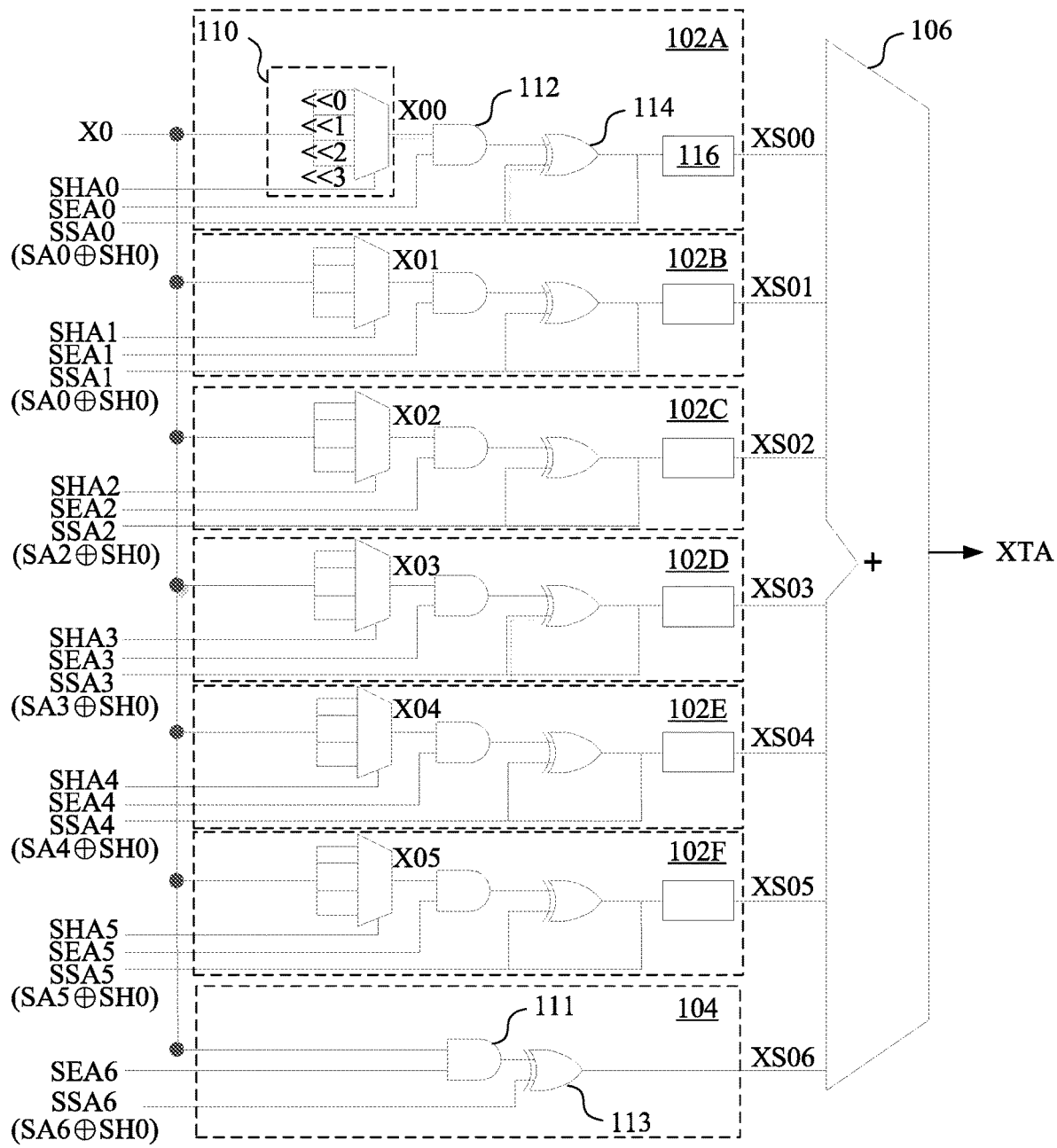
FIG. 2A is a detailed block diagram of the first term operation circuit in an embodiment of the present invention.

Reference is made to FIG. 2A. FIG. 2A is a detailed block diagram of the first term operation circuit 100 in an embodiment of the present invention. As described above, the first term operation circuit 100 is configured to calculate the first term $\pm X0 \times A$, and comprises: the higher bit operation circuits 102A-102F, the lowest bit operation circuit 104, and the first calculation circuit 106.

There are six higher bit operation circuits 102A-102F in this embodiment, and the structures thereof are similar. In the example of the higher bit operation circuit 102A, the higher bit operation circuit 102A comprises a bit left-shifting multiplexer 110, a bit output unit 112, a bit exclusive OR gate 114, and a bit left-shifting unit 116.

The bit left-shifting multiplexer 110 is configured to selectively left-shift the multiplicand X0 by different bits according to the shifting control signal SHAG determined by the multiplier A to generate the shifted multiplicand X00.

In one embodiment, the bit left-shifting multiplexer 110 is configured to selectively left-shift the multiplicand X0 by 0, 1, 2, or 3 bits according to the shifting control signal SHAG. Thus, in one implementation, the shifting control signal SHA0 is a two-bits control signal. For example, when the shifting control signal SHA0 is 00, 01, 10, or 11, the bit left-shifting multiplexer 110 left-shifts the multiplicand X0 by 0, 1, 2, or 3 bits, respectively, to output the shifted multiplicand X00.

The bit output unit 112 is configured to determine the output of the shifted multiplicand X00 according to a bit valid control signal SEA0 determined by the multiplier A. In one embodiment, the bit output unit 112 is implemented by AND gates, and the bit valid control signal SEA0 may have an invalid level of 0 and a valid level of 1.

Thus, when the bit valid control signal SEA0 is on the invalid level of 0, the bit output unit 112 may output the shifted multiplicand X00 as 0, regardless of the value of the shifted multiplicand X00. When the bit valid control signal SEA0 is on the valid level of 1, the bit output unit 112 may output the value of the shifted multiplicand X00.

The bit exclusive OR gate 144 is configured to determine the sign of the shifted multiplicand X00 according to a bit sign control signal SSA0. In one embodiment, the bit sign control signal SSA0 may have a negative level of 1 and a positive level of 0.

In one embodiment, the bit sign control signal SSA0 is generated by performing the exclusive OR logic operation for a higher bit sign signal SA0 determined by the multiplier A and a term sign signal SH0. The term sign signal SH0 is determined according to the sign of the first term. When the first term is positive, the sign of the term sign signal SH0 is 0, and when the first term is negative, the sign of the term sign signal SH0 is 1.

Thus, when the bit sign control signal SSA0 is on the negative level of 1, the bit exclusive OR gate 114 performs the exclusive OR logic operation for the shifted multiplicand X00 accordingly, to output the shifted multiplicand X00 as a negative number. When the bit sign control signal SSA0 is on the positive level of 0, the bit exclusive OR gate 114 performs the exclusive OR logic operation for the shifted multiplicand X00 accordingly, to output the shifted multiplicand X00 as a positive number. SSA0 may be added up to obtain the summation of a two's complement TC.

The bit left-shifting unit 116 is configured to left-shift the shifted multiplicand X00 by more bits when the bit corresponding to the higher bit operation circuit 102A is higher to generate a higher bit operation result XS00. In one embodiment, the higher bit operation circuit 102A corresponds to the highest bit, and left-shifts the shifted multiplicand X00 by 11 bits. The 11 bits of the lower bits may be filled with SSA0. When the bit sign control signal SSA0 is on the negative level of 1, the 11 lower bits are 11111111111, and when the bit sign control signal SSA0 is on the positive level of 0, the 11 lower bits are 00000000000.

Similarly, the bit left-shifting multiplexers 110 included in the higher bit operation circuits 102B-102F selectively left-shift the multiplicand X0 by 0, 1, 2, or 3 bits according to the shifting control signals SHA1-SHA5 to output the shifted multiplicands X01-X05, respectively. The bit output units 112 included in the higher bit operation circuits 102B-102F determine whether the outputs of the shifted multiplicands X01-X05 are valid according to the bit valid control signals SEA1-SEA5, respectively.

The bit exclusive OR gates 114 included in the higher bit operation circuits 102B-102F determine the signs of the shifted multiplicands X01-X05 according to the bit sign control signals SSA1-SSA5, respectively. SSA0-SSA5 may be added up to obtain the summation of the two's complement TC. The bit left-shifting units 116 included in the higher bit operation circuits 102B-102F left-shift the shifted multiplicands X01-X05 by more bits when the bits corresponding to the higher bit operation circuits 102B-102F are higher to generate the higher bit operation results XS01-XS05. For example, the bit left-shifting units 116 may sequentially left-shift the shifted multiplicands X01-X05 by 9, 7, 5, 3, and 1 bits, respectively, and the 9, 7, 5, 3, and 1 bits of the lower bits may be filled with SSA1, SSA2, SSA3, SSA4, and SSA5, respectively.

The lowest bit operation circuit 104 comprises a lowest bit output unit 111 and a lowest bit exclusive OR gate 113.

The lowest bit output unit 111 is configured to determine the output of the multiplicand X0 according to a lowest bit valid control signal SEA6 determined by the multiplier A. In one embodiment, the lowest bit output unit 111 is implemented by AND gates, and the lowest bit valid control signal SEA6 may have an invalid level of 0 and a valid level of 1.

Thus, when the lowest bit valid control signal SEA6 is on the invalid level of 0, the lowest bit output unit 111 may output the shifted multiplicand X00 as 0, regardless of the value of the shifted multiplicand X0. When the lowest bit valid control signal SEA6 is on the valid level of 1, the lowest bit output unit 111 may output the value of the multiplicand X0.

The lowest bit exclusive OR gate 113 is configured to determine the sign of the multiplicand X0 according to a lowest bit sign control signal SSA6. In one embodiment, the lowest bit sign control signal SSA6 may have a positive level of 0 and a negative level of 1.

In one embodiment, the lowest bit sign control signal SSA6 is generated by performing the exclusive OR logic operation for a lowest bit sign signal SA6 determined by the multiplier A and a term sign signal SH0.

Thus, when the lowest bit sign control signal SSA6 is on the negative level of 1, the lowest bit exclusive OR gate 113 performs the exclusive OR logic operation for the multiplicand X0 accordingly, to output the multiplicand X0 as a negative number. When the lowest bit sign control signal SSA6 is on the positive level of 0, the lowest bit exclusive OR gate 113 performs the exclusive OR logic operation for the multiplicand X0 accordingly, to output the multiplicand X0 as a positive number. SSA6 may be added up to obtain the summation of the two's complement TC. The multiplicand X0 with sign output from the lowest bit exclusive OR gate 113 is a lowest bit operation result XS06.

It should be noted that the above operations on obtaining the summation of the two's complement TC may be determined by performing the lookup and pre-statistics based on the algorithms of DCT, DST, IDCT, and IDST to reduce the calculation.

The first calculation circuit 106 is capable of adding the higher bit operation results XS01-XS05 and the lowest bit operation result XS06 to generate a term operation result XTA. In some embodiments, the first calculation circuit 106 is a first adder configured to add the higher operation results XS01-XS05 and the lowest bit operation result XS06 to generate the term operation result XTA.

In one embodiment, the shifting control signals SHA0-SHA5, the bit valid control signals SEA0-SEA5, the bit sign control signals SA0-SA5, the lowest bit valid control signal SEA6, and the lowest bit sign control signal SA6 are determined by performing the lookup for a multiplier correspondence table with the multiplier A.

Reference is made to Table 1. Table 1 is the content of a multiplier correspondence table in one embodiment of the present invention.

TABLE 1

| Multiplier A | SEA0-SEA6 | SA0-SA6 | SHA0-SHA5 |
|---|---|---|---|
| 0 | 0000000 | 0000000 | 000000000000 |
| 2 | 0000010 | 0000000 | 000000000000 |
| 4 | 0000010 | 0000000 | 000000000001 |
| 64 | 0000100 | 0000000 | 000000001100 |
| 87 | 0001111 | 0000001 | 000000010110 |
| 75 | 0001111 | 0000000 | 000000010000 |
| 50 | 0001110 | 0000000 | 000000000100 |
| 18 | 0000110 | 0000000 | 000000000100 |
| 83 | 0001111 | 0000000 | 000000010100 |
| 36 | 0000110 | 0000000 | 000000001001 |
| 90 | 0011110 | 0001100 | 000000000000 |

In one embodiment, the multiplier correspondence table shown in Table 1 may be used in the video compression standards of HEVC/AVS2/VVC/AVS3. It should be noted that Table 1 only lists some values by way of example. In practical applications, the multiplier correspondence table may comprise more values corresponding to each other, and is not limited to the values listed in Table 1.

The content corresponding to the field in the first column is the value of the multiplier A, such as 87 corresponding to the field in the second column and the fifth row. The content corresponding to the field of the second column is the content of the bit valid control signals SEA0-SEA5 and the lowest bit valid control signal SEA6, and the numeral of each field, such as 0001111 corresponding to the second column and the fifth row, is mapped from the highest bit to the lowest bit sequentially.

The content corresponding to the field of the third column is the content of the higher bit sign signals SA0-SA5 and the lowest bit sign signal SA6, and the numeral of each field, such as 0000001 corresponding to the second column and the fifth row, is mapped to the values of the signals from the highest bit to the lowest bit sequentially. The content corresponding to the field of the fourth column is the content of the shifting control signals SHA0-SHA5, and the numeral of each field, such as 000000010110 corresponding to the second column and the fifth row, is mapped to the values of the signals from the highest bit to the lowest bit sequentially in every two bits.

Thus, in the above example that the multiplier A is 87, when X0 is expressed in hexadecimal as 0x0001, the bit left-shifting multiplexers 110 included in the higher bit operation circuits 102A-102F left-shift the multiplicand by 0, 0, 0, 1, 1, and 2 bits according to the values of the shifting control signals SHA0-SHA5 (000000010110) obtained by the lookup, respectively, to generate the shifted multiplicands X00-X05 of 0x0001, 0x0001, 0x0001, 0x0002, 0x0002, and 0x0004, respectively.

Next, the bit output units 112 included in the higher bit operation circuits 102A-102F and the lowest bit output unit 111 included in the lowest bit operation circuits 104 determine that the shifted multiplicands X00-X02 are invalid and output the shifted multiplicands X00-X02 as 0 according to the values of the bit valid control signals SEA0-SEA5 and the lowest bit valid control signal SEA6 (0001111) obtained by performing the lookup, and determine that the shifted multiplicands X03-X06 are valid, respectively. Therefore, the bit output units 112 included in the higher bit operation circuits 102A-102F and the lowest bit output unit 111 included in the lowest bit operation circuits 104 output 0x0000, 0x0000, 0x0000, 0x0002, 0x0002, 0x0004, and 0x0001, respectively.

The bit exclusive OR gates 114 included in the higher bit operation circuits 102A-102F and the lowest bit exclusive OR gate 113 included in the lowest bit operation circuits 104 determine that the signs of the shifted multiplicands X00-X05 and the multiplicand X0 according to the values of the bit sign control signals SSA0-SSA5 and the lowest bit sign control signal SSA6 obtained by performing the lookup, respectively. More specifically, the values of the bit sign control signals SSA0-SSA5 and the lowest bit sign control signal SSA6 are generated by performing the exclusive OR logical operations for the values (0000001) of the higher bit sign signals SA0-SA5 and the lowest bit sign signal SA6 obtained by performing the lookup with the term sign signal SH0, respectively.

In this embodiment, the term sign signal SH0 is 0 based on the first term with the positive sign. Therefore, the values of the bit sign control signals SSA0-SSA5 and the lowest bit sign control signal SSA6 are (0000001), respectively. The bit exclusive OR gates 114 included in the higher bit operation circuits 102A-102F output the shifted multiplicands X00-X05 with the signs, respectively, and the shifted multiplicands X00-X05 are 0x0000, 0x0000, 0x0000, 0x0002, 0x0002, and 0x0004, respectively. Then, the lowest bit exclusive OR gate 113 included in the lowest bit operation circuits 104 output the multiplicand X0 with the sign, to generate the lowest bit operation result XS06 of 0xFFFE.

Next, the bit left-shifting units 116 included in the higher bit operation circuits 102A-102F left-shift the shifted multiplicands X00-X05 with the signs by 11, 9, 7, 5, 3, and 1 bits to generate the higher bit operation results XS00-XS05, respectively. Since the shifted multiplicands X00-X02 are 0, the higher bit operation results XS00-XS02 after left-shifting of the bits are still 0. The shifted multiplicands X03-X05 are 0x0002, 0x0002, and 0x0004, respectively, and thus the higher bit operation results XS03-XS05 after left-shifting by 5, 3, and 1 bits are 0x0040, 0x0010, and 0x0008, respectively.

The first calculation circuit 106 adds the higher bit operation results XS00-XS05 and the lowest bit operation result XS06 to generate the term operation result XTA corresponding to ±X0×A. Therefore, the term operation result XTA is 0x0040+0x0010+0x0008+0xFFFE=0x0056.

Therefore, the first term operation circuit 100 may calculate the first term ±X0×A according to the process described above.

Figure 2B:
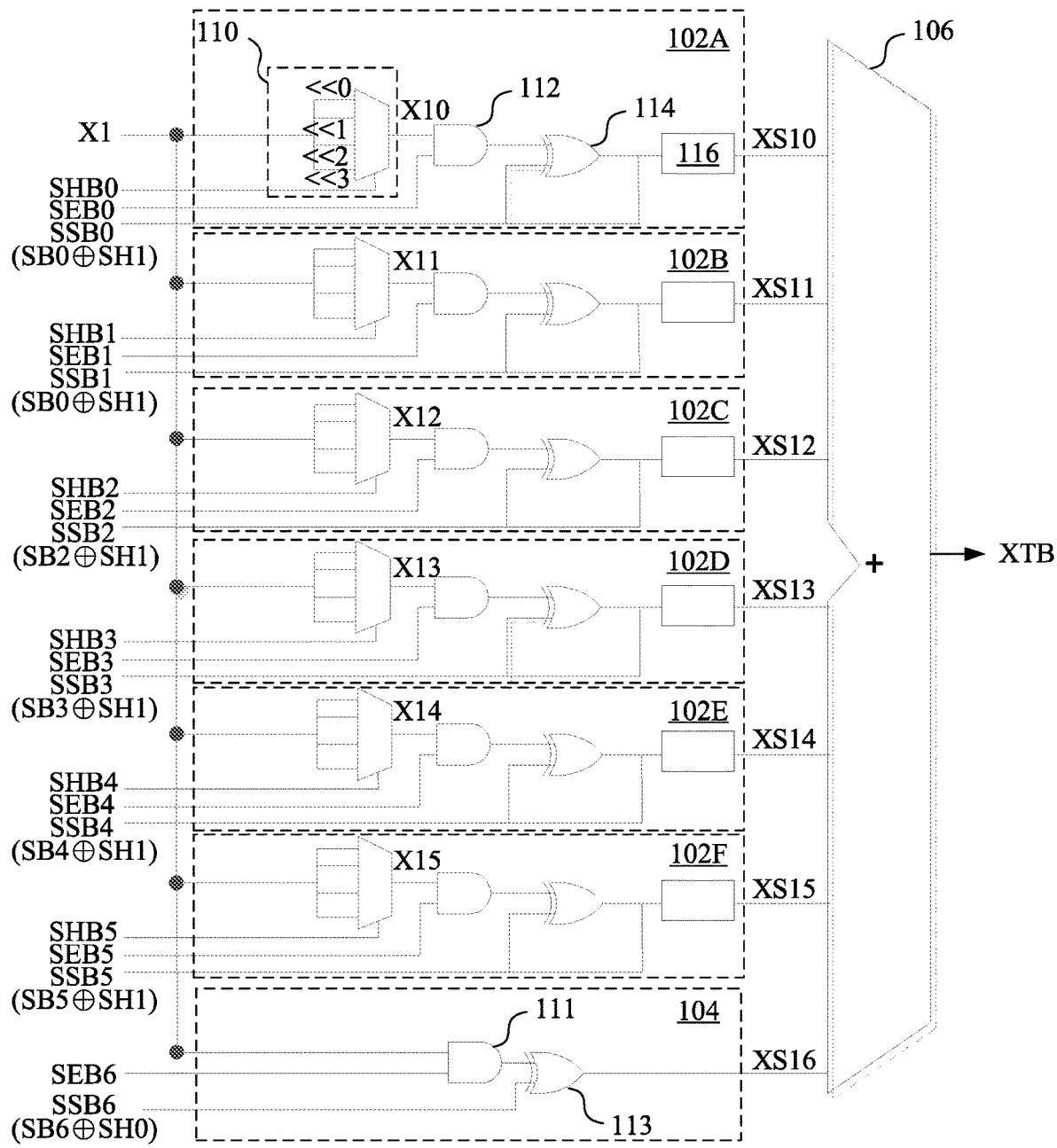
FIG. 2B is a detailed block diagram of the second term operation circuit in an embodiment of the present invention.

Reference is made to FIG. 2B. FIG. 2B is a detailed block diagram of the second term operation circuit 120 in an embodiment of the present invention.

Similarly, the second term operation circuit 120 may also have the same structure with the first term operation circuit 100, and may comprise: the higher bit operation circuits 102A-102F, the lowest bit operation circuit 104, and the first calculation circuit 106.

The higher bit operation circuits 102A-102F, the lowest bit operation circuit 104, and the first calculation circuit 106 may also perform the calculation according to the shifting control signals SHB0-SHB5, the bit valid control signals SEB1-SEB5 and the lowest bit valid control signal SEB6, and the bit sign control signal SSB0-SSB5 and the lowest bit sign control signal SSB6 obtained by performing the lookup to generate the higher bit operation results XS10-XS15 and the lowest bit operation result XS16. In addition, the first calculation circuit 106 may add the higher bit operation results XS10-XS15 and the lowest bit operation result XS16 to generate the term operation result XTB corresponding to ±X1×B.

Since the structure and the calculation way of the second term operation circuit 120 and the first term operation circuit 100 are similar, the detail of the second term operation circuit 120 is omitted.

It is noted that, in the second term operation circuit 120, the bit exclusive OR gates 114 included in the higher bit operation circuits 102A-102F and the lowest bit exclusive OR gate 113 included in the lowest bit operation 104 determine that the signs of the shifted multiplicands X10-X15 and the multiplicand X1 according to the values of the bit sign control signals SSB0-SSB5 and the lowest bit sign control signal SSB6 obtained by performing the lookup, respectively. More specifically, the values of the bit sign control signals SSB0-SSB5 and the lowest bit sign control signal SSB6 are generated by performing the exclusive OR logical operations for the values of the higher bit sign signals SB0-SB5 and the lowest bit sign signal SB6 obtained by performing the lookup with the term sign signal SH1, respectively.

Reference is made to the value of the multiplier B in Table 1, such as 90 corresponding to the field in the second column and the eleventh row. The content corresponding to the field of the second column is the content of the bit valid control signals SEB0-SEB5 and the lowest bit valid control signal SEB6, and the numeral of each field, such as 0011110 corresponding to the second column and the fifth row, is mapped from the highest bit to the lowest bit sequentially.

The content corresponding to the field of the third column is the content of the higher bit sign signals SB0-SB5 and the lowest bit sign signal SB6, and the numeral of each field, such as 0001100 corresponding to the second column and the eleventh row, is mapped to the values of the signals from the highest bit to the lowest bit sequentially. The content corresponding to the field of the fourth column is the content of the shifting control signals SHB0-SHB5, and the numeral of each field, such as 000000000000 corresponding to the second column and the fifth row, is mapped to the values of the signals from the highest bit to the lowest bit sequentially in every two bits.

Thus, in the above example that the multiplier B is 90, when X1 is expressed in hexadecimal as 0x0001, the bit left-shifting multiplexers 110 included in the higher bit operation circuits 102A-102F left-shift the multiplicand by 0, 0, 0, 0, 0, and 0 bits according to the values of the shifting control signals SHB0-SHB5 (000000000000) obtained by the lookup, respectively, to generate the shifted multiplicands X10-X15 of 0x0001, 0x0001, 0x0001, 0x0001, 0x0001, and 0x0001, respectively.

Next, the bit output units 112 included in the higher bit operation circuits 102A-102F and the lowest bit output unit 111 included in the lowest bit operation circuits 104 determine that the shifted multiplicands X10-X11 are invalid and output the shifted multiplicands X00-X02 as 0 according to the values of the bit valid control signals SEB1-SEB5 and the lowest bit valid control signal SEB6 (0011110) obtained by performing the lookup, and determine that the shifted multiplicands X12-X15 are valid, respectively. Therefore, the bit output units 112 included in the higher bit operation circuits 102A-102F and the lowest bit output unit 111 included in the lowest bit operation circuits 104 output 0x0000, 0x0000, 0x0001, 0x0001, 0x0001, 0x0001, and 0x0000, respectively.

The bit exclusive OR gates 114 included in the higher bit operation circuits 102A-102F and the lowest bit exclusive OR gate 113 included in the lowest bit operation circuits 104 determine that the signs of the shifted multiplicands X10-X15 and the multiplicand X1 according to the values of the bit sign control signals SSB0-SSB5 and the lowest bit sign control signal SSB6 obtained by performing the lookup, respectively. More specifically, the values of the bit sign control signals SSB0-SSB5 and the lowest bit sign control signal SSB6 are generated by performing the exclusive OR logical operations for the values (0001100) of the higher bit sign signals SB0-SB5 and the lowest bit sign signal SB6 obtained by performing the lookup with the term sign signal SH1, respectively.

In this embodiment, the term sign signal SH1 is 1 based on the second term with the negative sign. Therefore, the values of the bit sign control signals SSB0-SSB5 and the lowest bit sign control signal SSB6 are (1110011), respectively. The bit exclusive OR gates 114 included in the higher bit operation circuits 102A-102F output the shifted multiplicands X10-X15 with the signs, respectively, and the shifted multiplicands X10-X15 are 0xFFFF, 0xFFFF, 0xFFFE, 0x0001, 0x0001, and 0xFFFE, respectively. Then, the lowest bit exclusive OR gate 113 included in the lowest bit operation circuits 104 output the multiplicand X1 with the sign, to generate the lowest bit operation result XS16 of 0xFFFF.

Next, the bit left-shifting units 116 included in the higher bit operation circuits 102A-102F left-shift the shifted multiplicands X10-X15 with the signs by 11, 9, 7, 5, 3, and 1 bits to generate the higher bit operation results XS10-XS15, respectively. Since the shifted multiplicands X10-X11 are 0xFFFF, the higher bit operation results XS00-XS01 after left-shifting of the bits are still 0xFFFF. The shifted multiplicands X12-X15 are 0xFFFE, 0x0001, 0x0001, and 0xFFFE, respectively, and thus the higher bit operation results XS10-XS15 after left-shifting by 11, 9, 7, 5, 3, and 1 bits are 0xFFFF, 0xFFFF, 0xFF7F, 0x0020, 0x0008, and 0xFFFD, respectively.

The first calculation circuit 106 adds the higher bit operation results XS10-XS15 and the lowest bit operation result XS16 to generate the term operation result XTB corresponding to ±X1×B. Therefore, the term operation result XTB is 0xFFFF+0xFFFF+0xFF7F+0x0020+0x0008+0xFFFD+0xFFFF=0xFFA1.

The third term operation circuit 140 comprises a term output unit 150, a term exclusive OR gate 152, and a third calculation circuit 154.

The term output unit 150 is configured to determine whether the output of the addend C is valid according to the term valid control signal SEC. When the term valid control signal SEC is on the invalid level of 0, the term output unit 150 may output the addend C as 0, regardless of the value of the addend C. When the term valid control signal SEC is on the valid level of 1, the term output unit 150 may output the value of the addend C.

The term exclusive OR gate 152 determines the sign of the addend C according to the term sign control signal SSC. In this embodiment, when the third term is positive, the term sign control signal SSC is 0, and the term exclusive OR gate 152 output the positive value of the addend C after performing the exclusive OR logic operation. When the third term is negative, the term sign control signal SSC is 1, and the term exclusive OR gate 152 output the negative value of the addend C after performing the exclusive OR logic operation.

The third calculation circuit 154 is a third adder, and is configured to add the addend C with the sign to the summation of the two's complement TC to generate the third term operation result XTC. Since the coefficients of the matrix of DCT, DST, IDCT, and IDST are constant, and SH0 and SH1 are known based on the regular transforming process, the summation of the two's complement TC may be known by performing the lookup and pre-statistics, and the summation of the two's complement TC is the summation of the bit sign control signals SSA0-SSA6, SSB0-SSB6 of higher bit operation circuits 102A-102F and the term sign control signal SSC regarding the negative two's complement. Thus, the calculation Y=+87×1−90×1+0, SCC0=0, TC=1+5+0, and then XTC=6.

The second calculation circuit 160 is capable of adding the term operation results XTA, XTB of the first and second term operation circuits 100, 120 and the third term operation result XTC to generate a total operation result Y. In some embodiments, the second calculation circuit 160 is a second adder configured to add the term operation results XTA, XTB of the first and second term operation circuits 100, 120 and the third term operation result XTC to generate a total operation result Y. It is noted that the second calculation circuit 160 is illustrated as a single adder in FIG. 1. However, in practice, the second calculation circuit 160 may also be implemented by two adders. One of the two adders adds the term operation result XTA to the term operation result XTB, and the other adds the result of the previous adder to the third term operation result XTC, to generate the total operation result Y. The present invention is not limited thereto. The example of Y=±X0×A±X1×B±C=+1×87−1×90+0=−3 is listed, where XTA=0x0056; XTB=0xFFA1; XTC=6; Y=XTA+XTB+XTC=0x0056+0xFFA1+6=0xFFFD.

It is noted that the above embodiment is described with reference to the multiplier correspondence table used in the video compression standards of one of HEVC/AVS2/VVC/AVS3. In other embodiments, the computation circuit 1 of the present invention may also be implemented by the multiplier correspondence table applied to, for example, but not limited to, the VP9 and AV1 video compression standard.

The computation circuit of the present invention facilitates circuit synthesis in an easy-to-simplify manner to reduce the time delay from the two's complement operation and reduce the routing complexity, and thus has the advantages of low delay and small area.

Although the present application has been described in considerable detail with reference to certain embodiments thereof, it is not used to limit the present application. It will be apparent to those skilled in the art that various modifications and variations may be made without departing from the scope or spirit of the present application. Thus, the scope of the present application falls within the scope of the following claims.

What is claimed is:

1. A circuit comprising:
a first term operation circuit and a second term operation circuit, each including:
a plurality of higher bit operation circuits, each configured to selectively left-shift a multiplicand by different bits according to a shifting control signal determined by a multiplier to generate a shifted multiplicand, configured to output the shifted multiplicand only according a valid level of a bit valid control signal determined by the multiplier, configured to determine a sign of the shifted multiplicand according to a bit sign control signal and a term sign signal determined by the multiplier, and configured to left-shift the shifted multiplicand by more bits when the bit corresponding to each of the plurality of the higher bit operation circuits is higher to generate a higher bit operation result;
a lowest bit operation circuit configured to output the multiplicand only according to a valid level of a lowest bit valid control signal determined by the multiplier, and configured to determine a sign of the multiplicand according to a lowest bit sign control signal and the term sign signal determined by the multiplier to generate a lowest bit operation result; and
a first calculation circuit capable of adding the higher operation results and the lowest bit operation result to generate a term operation result;
a third term operation circuit configured to output an addend according to a valid level of a term valid control signal, configured to determine a sign of the addend according to the term sign control signal, and configured to add the addend to a summation of a two's complement to generate a third term operation result; and
a second calculation circuit capable of adding the term operation result of the first and second term operation circuits and the third term operation result to generate a total operation result.

2. The circuit of claim 1, wherein each of the higher bit operation circuits comprises:
a bit left-shifting multiplexer configured to selectively left-shift the multiplicand by the different bits according to the shifting control signal to generate the shifted multiplicand;
a first logic gate configured to output the shifted multiplicand when the bit valid control signal is on the valid level, and output the shifted multiplicand as zero when the bit valid control signal is on an invalid level; and
a bit exclusive OR gate configured to output the shifted multiplicand as a positive number when the bit sign control signal is on a positive level, and output the shifted multiplicand as a negative number when the bit sign control signal is on a negative level.

3. The circuit of claim 2, wherein the higher bit operation circuits comprise six higher bit operation circuits, and the higher bit operation circuits left-shift 11 bits, 9 bits, 7 bits, 5 bits, 3 bits, and 1 bit, respectively.

4. The circuit of claim 2, wherein the bit left-shifting multiplexer selectively left-shifts the multiplicand by 0, 1, 2, or 3 bits according to the shifting control signal to generate the shifted multiplicand.

5. The circuit of claim 2, wherein the lowest bit operation circuit comprises:
- a second logic gate configured to output the multiplicand when the lowest bit valid control signal is on the valid level, and output the multiplicand as zero when the lowest bit valid control signal is on the invalid level; and
- a lowest bit exclusive OR gate configured to output the multiplicand as a positive number when the lowest bit sign control signal is on the positive level, and output the multiplicand as a negative number when the lowest bit sign control signal is on the negative level to generate the lowest bit operation result.

6. The circuit of claim 1, wherein the third term operation circuit further comprises:
- a first logic gate configured to output the addend when the term valid control signal is on the valid level, and output the addend as zero when the term valid control signal is on an invalid level;
- a term exclusive OR gate configured to output the addend as a positive number when the term sign control signal is on a positive level, and output the addend as a negative number when the term sign control signal is on a negative level; and
- a third calculation circuit capable of adding the addend to the summation of the two's complement to generate the third term operation result.

7. The circuit of claim 6, wherein the third calculation circuit is a third adder configured to add the addend to the summation of the two's complement to generate the third term operation result.

8. The circuit of claim 1, wherein the shifting control signal, the bit valid control signal, the bit sign control signal, the lowest bit valid control signal and the lowest bit sign control signal are determined by performing a lookup for a multiplier correspondence table with the multiplier.

9. The circuit of claim 8, wherein the multiplier correspondence table corresponds to one of standards of HEVC, AVS2, VP9, AV1, VVC, and AVS3.

10. The circuit of claim 1, wherein the summation of the two's complement is the summation of the bit sign control signals, the lowest bit sign control signals, and the term sign control signals of the higher bit operation circuits of the first and second term operation circuits.

11. The circuit of claim 1, wherein the bit sign control signal is generated by performing a exclusive OR logic operation for a higher bit sign signal determined by the multiplier and a term sign signal, and the lowest bit sign control signal is generated by performing the exclusive OR logic operation for a lowest bit sign signal determined by the multiplier and the term sign signal.

12. The circuit of claim 1, wherein the first calculation circuit is a first adder configured to add the higher operation results and the lowest bit operation result to generate the term operation result.

13. The circuit of claim 1, wherein the second calculation circuit is a second adder configured to add the term operation result of the first and second term operation circuits and the third term operation result to generate the total operation result.

* * * * *